United States Patent
Saifuddin et al.

(10) Patent No.: US 9,349,431 B1
(45) Date of Patent: May 24, 2016

(54) SYSTEMS AND METHODS TO REFRESH STORAGE ELEMENTS

(71) Applicant: QUALCOMM Incorporated, San Diego, CA (US)

(72) Inventors: Mosaddiq Saifuddin, San Diego, CA (US); Jung Pill Kim, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/660,366

(22) Filed: Mar. 17, 2015

(51) Int. Cl.
*G11C 7/00* (2006.01)
*G11C 11/406* (2006.01)
*G11C 11/408* (2006.01)
*G11C 11/4096* (2006.01)

(52) U.S. Cl.
CPC ............ *G11C 11/406* (2013.01); *G11C 11/408* (2013.01); *G11C 11/4096* (2013.01)

(58) Field of Classification Search
CPC ... G11C 11/406; G11C 11/40611; G11C 7/00
See application file for complete search history.

(56) References Cited

U.S. PATENT DOCUMENTS

| | | | |
|---|---|---|---|
| 6,603,694 B1 * | 8/2003 | Frankowsky | G11C 11/406 365/222 |
| 8,711,647 B2 | 4/2014 | Wang | |
| 8,756,368 B2 | 6/2014 | Best et al. | |
| 2012/0300568 A1 | 11/2012 | Park et al. | |
| 2013/0262740 A1 * | 10/2013 | Kim | G11C 16/3418 711/102 |
| 2013/0279283 A1 * | 10/2013 | Seo | G11C 11/40611 365/222 |
| 2013/0279284 A1 | 10/2013 | Jeong | |
| 2014/0016421 A1 * | 1/2014 | Kim | G11C 7/00 365/222 |
| 2014/0085999 A1 | 3/2014 | Kang | |
| 2014/0169114 A1 * | 6/2014 | Oh | G11C 11/40611 365/222 |

* cited by examiner

*Primary Examiner* — Tuan T Nguyen
(74) *Attorney, Agent, or Firm* — Toler Law Group, PC (57) ABSTRACT

A method of performing refresh operations on a storage device includes identifying word lines coupled to weak storage elements. The method also includes grouping a plurality of word lines having distinct bank offsets onto a single refresh address. Each of the plurality of word lines is coupled to a corresponding weak storage element. The method further includes performing a refresh of the single refresh address.

30 Claims, 8 Drawing Sheets

SYSTEMS AND METHODS TO REFRESH STORAGE ELEMENTS

I. FIELD

The present disclosure is generally related to refreshing storage elements.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless communication devices, such as cellular telephones and internet protocol (IP) telephones, can communicate voice and data packets over wireless networks. Further, many such wireless communication devices include other types of devices that are incorporated therein. For example, a wireless communication device can also include a digital still camera, a digital video camera, a digital recorder, and an audio file player. Also, such wireless communication devices can process executable instructions, including software applications, such as a web browser application, that can be used to access the Internet. As such, these wireless communication devices can include significant computing capabilities.

Wireless communication devices may include volatile memory devices with storage elements (e.g., memory cells) that are periodically refreshed to maintain data integrity. For example, retention times of some of the storage elements may be lower than a threshold retention time (e.g., 32 milliseconds). Various approaches have been proposed to maintain data integrity in the presence of low retention times. In a first approach, a frequency of refresh commands may be increased such that memory cells are refreshed within a worst-case retention time. The worst-case retention time may correspond to a retention time of a particular memory cell that has a lowest retention time of a plurality of memory cells. In this approach, the number of refresh commands issued in a particular period of time may be doubled or more such that many of the memory cells are refreshed much more frequently than needed. In a second approach, an additional refresh command may be issued for each memory cell with a low retention time. In this approach, the number of refresh commands issued during the particular period of time may be increased by a number of memory cells with a low retention time. In both approaches, in response to a refresh command, an address of a single row of memory cells is retrieved and each cell in the single row of memory cells is refreshed.

III. SUMMARY

Systems and methods of refreshing storage elements are disclosed. A device may include a memory array having a plurality of memory banks. The plurality of memory banks may include a plurality of rows of storage elements (e.g., memory cells). Each row of storage elements may be coupled to a particular word line. The device may also include refresh circuitry (e.g., peripheral circuitry, a memory controller, or both) coupled to the memory array. The memory array may include one or more "weak storage elements" that have a data retention time that is lower than a threshold retention time. The weak storage elements may be identified during a testing phase of a manufacturing process of the memory array or the device. Information (e.g., addresses) identifying word lines coupled to the "weak rows" of storage elements of the memory array may be stored in a storage device (e.g., one time programmable (OTP) memory). A weak row may include at least one weak storage element. The refresh circuitry may be coupled to the OTP memory.

Each of a plurality of word lines having distinct bank offsets may be coupled to a corresponding weak storage element. For example, a first word line of a first memory bank of the memory array may have a first bank offset and a second word line of a second memory bank of the memory array may have a second bank offset. The first word line may be coupled to a first row of storage elements. The first row of storage elements may include at least one weak storage element. The second word line may be coupled to a second row of storage elements. The second row of storage elements may include at least one weak storage element.

The refresh circuitry may group the first word line and the second word line onto a single refresh address. For example, the refresh circuitry may group the first word line and the second word line by mapping the single refresh address to a first word line address of the first word line and a second word line address of the second word line. To illustrate, the refresh circuitry may map the single refresh address to the first word line address and the second word line address based on data stored in the OTP memory.

The refresh circuitry may perform a refresh of the single refresh address. For example, the single refresh address may map to word line addresses of word lines that are coupled to rows of storage elements. The refresh circuitry may perform a refresh of the single refresh address by performing a refresh of the corresponding row of storage elements. For example, the refresh circuitry may perform a refresh of the first row of storage elements and the second row of storage elements. The refresh circuitry may perform the refresh by reading first data from the first row of storage elements, writing the first data to the first row of storage elements, reading second data from the second row of storage elements, and writing the second data to the second row of storage elements.

In a particular aspect, a method of performing refresh operations on a storage device includes identifying word lines coupled to weak storage elements. The method also includes grouping a plurality of word lines having distinct bank offsets onto a single refresh address. Each of the plurality of word lines is coupled to a corresponding weak storage element. For example, the plurality of word lines may be a subset of the identified word lines. The method further includes performing a refresh of the single refresh address.

In another aspect, a device includes a memory array and a storage device. The device also includes refresh circuitry. The memory array includes a plurality of rows of storage elements. Each row is coupled to a particular word line. The storage device is configured to store information identifying word lines coupled to weak storage elements. The refresh circuitry is configured to group a plurality of word lines having distinct bank offsets onto a single refresh address. Each of the plurality of word lines is coupled to a corresponding weak storage element. For example, the plurality of word lines may be a subset of the identified word lines. The refresh circuitry is also configured to perform a refresh of the single refresh address. For example, the refresh circuitry may map the single refresh address to a plurality of word line addresses based on the information stored in the storage device. The plurality of word line addresses may identify the plurality of word lines. The plurality of word lines may be coupled to rows of storage elements. The refresh circuitry may perform a refresh of the single refresh address by performing a refresh of the corresponding rows of storage elements. The refresh circuitry may refresh each of the rows of storage elements by reading data from the row of storage elements and writing the data to the row of storage elements.

In another aspect, a system includes a memory array and a storage device. The system also includes refresh circuitry. The memory array includes a plurality of rows of storage elements. Each row is coupled to a particular word line. The storage device is configured to store information identifying word lines coupled to weak storage elements. The refresh circuitry is configured to group a plurality of word lines having distinct bank offsets onto a single refresh address. Each of the plurality of word lines is coupled to a corresponding weak storage element. The refresh circuitry is also configured to perform a refresh of the single refresh address.

One particular advantage provided by at least one of the disclosed examples is that multiple weak rows corresponding to distinct bank offsets may be refreshed using a single refresh address. For example, a refresh address may map to word line addresses of word lines coupled to weak rows. The refresh address may be determined in response to receiving (or generating) a refresh command. In this example, multiple weak rows having distinct bank offsets may be refreshed based on the refresh address in response to a single refresh command. Other aspects, advantages, and features of the present disclosure will become apparent after review of the entire application, including the following sections: Brief Description of the Drawings, Detailed Description, and the Claims.

V. DETAILED DESCRIPTION

Figure 1:
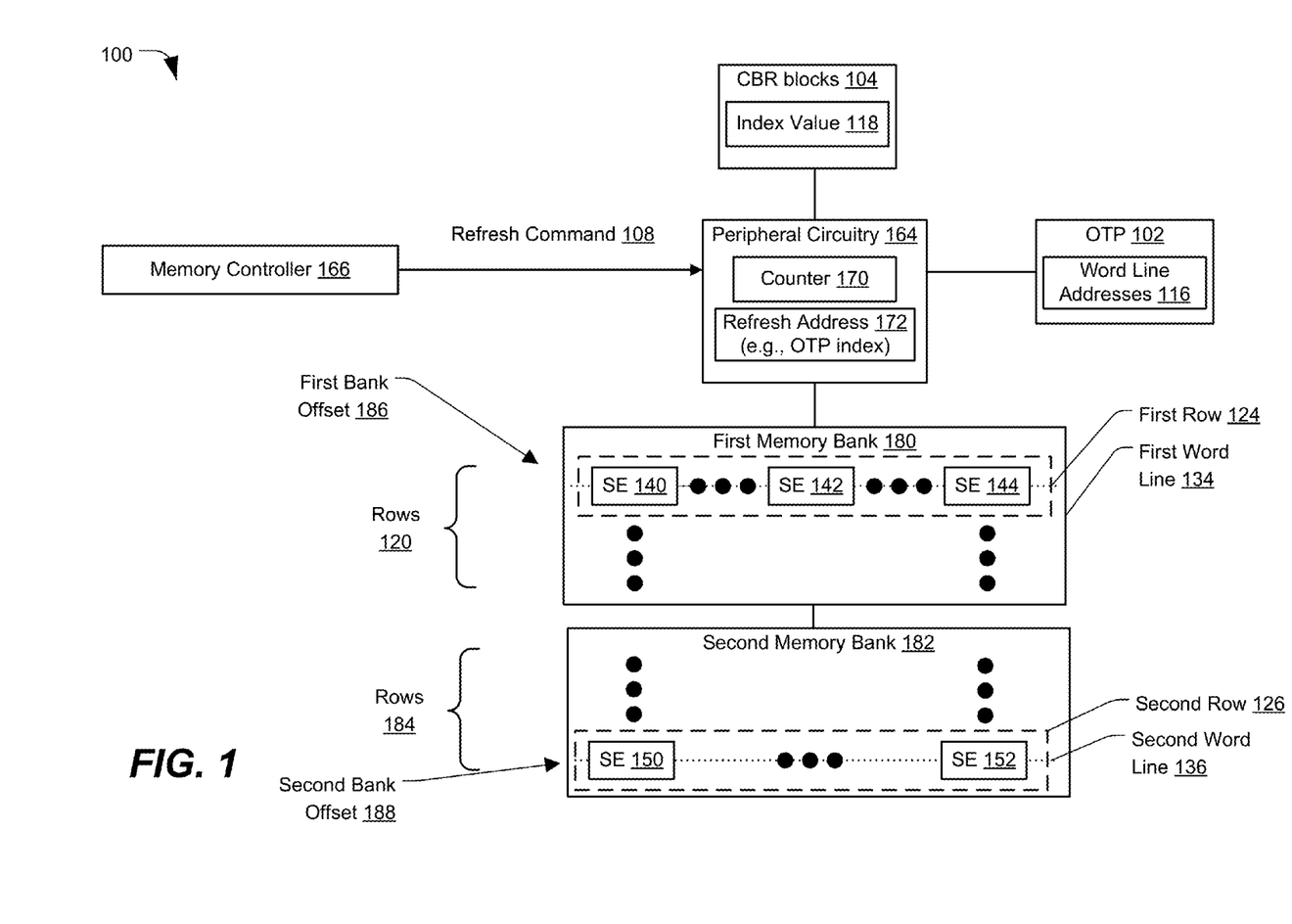
FIG. 1 is a block diagram of a particular illustrative example of a system operable to refresh storage elements.

Referring to FIG. 1, a particular illustrative example of a system operable to refresh storage elements is disclosed and generally designated 100. In a particular aspect, one or more components of the system 100 may be integrated into a communications device, a personal digital assistant (PDA), a tablet, a computer, a music player, a video player, an entertainment unit, a navigation device, or a set top box.

It should be noted that in the following description, various functions performed by the system 100 of FIG. 1 are described as being performed by certain components or modules. However, this division of components and modules is for illustration only. In an alternate example, a function performed by a particular component or module may be divided amongst multiple components or modules. Moreover, in an alternate example, two or more components or modules of FIG. 1 may be integrated into a single component or module. Each component or module illustrated in FIG. 1 may be implemented using hardware (e.g., a field-programmable gate array (FPGA) device, an application-specific integrated circuit (ASIC), a digital signal processor (DSP), a controller, etc.), software (e.g., instructions executable by a processor), or any combination thereof.

The system 100 includes a memory array (e.g., a volatile memory) including a plurality of memory banks (e.g., a first memory bank 180 and a second memory bank 182). The plurality of memory banks may include an array of storage elements (e.g., memory cells). For example, the first memory bank 180 includes rows 120 of storage elements. A first row 124 of the rows 120 may include a storage element (SE) 140, an SE 142, an SE 144, one or more other storage elements, or a combination thereof. The second memory bank 182 includes rows 184 of storage elements. A second row 126 of the rows 184 may include an SE 150, an SE 152, one or more other storage elements, or a combination thereof.

Each row of the first memory bank 180 and the second memory bank 182 may be coupled to a corresponding word line. For example, the first row 124 may be coupled to a first word line 134, and the second row 126 may be coupled to a second word line 136. The memory array may be divided into a plurality of regions across a plurality of memory banks, as described with reference to FIG. 3. Each memory bank may include a plurality of sections, as described with reference to FIG. 3.

A bank offset of a word line of a particular memory bank may indicate a row index of a corresponding row of storage elements in the particular memory bank. For example, the first word line 134 may have a first bank offset 186 indicating a first row index of the first row 124 in the rows 120. The second word line 136 may have a second bank offset 188 indicating a second row index of the second row 126 in the rows 184. The first bank offset 186 may be distinct from the second bank offset 188.

The system 100 may include refresh circuitry (e.g., a memory controller 166, peripheral circuitry 164, or both) coupled to the first memory bank 180 and the second memory bank 182. The system 100 may include column select (CAS) before row select (RAS) refresh (CBR) blocks 104, a non-volatile memory (e.g., a one-time programmable (OTP) memory 102), or both. The CBR blocks 104, the OTP memory 102, or both, may be coupled to the refresh circuitry (e.g., the peripheral circuitry 164). In a particular implementation, at least one of the CBR blocks 104, the OTP memory 102, and the peripheral circuitry 164 may be included in a volatile memory device or a dynamic random access memory (DRAM).

The OTP memory 102 may store (or indicate) word line addresses 116 of a first subset of rows (e.g., weak rows) of the rows 120 and the rows 184. Each row of the first subset of rows may be coupled to at least one storage element that has a data retention time that fails to satisfy (e.g., is lower than) a threshold retention time (e.g., 32 milliseconds). In a particular example, the OTP memory 102 may store (or indicate) second word line addresses of a second subset of rows (e.g., strong rows) of the rows 120 and the rows 184. Each storage element of each row of the second subset of rows may have a data retention time that satisfies (e.g., is greater than or equal to) the threshold retention time. The first subset of rows, the second subset of rows, or both, may be identified during a screening (or test) as part of a manufacturing process of the first memory bank 180 and the second memory bank 182, and data indicating the word line addresses 116, the second word line addresses, or a combination thereof, may be stored in the OTP memory 102.

During operation, the refresh circuitry (e.g., the memory controller 166 or the peripheral circuitry 164) may generate a refresh command 108. For example, the refresh circuitry may periodically generate the refresh command 108. The refresh circuitry may generate a particular number (e.g., 8192 (8K)+ 512) of refresh commands within a particular time period (e.g., 32 milliseconds). In a particular implementation, the memory controller 166 may generate the refresh command 108 and may provide the refresh command 108 to the peripheral circuitry 164. In an alternate implementation, the peripheral circuitry 164 may generate the refresh command 108.

The peripheral circuitry 164 may determine whether the refresh command 108 is a weak row refresh command based on a counter 170. For example, every nth refresh command may correspond to a weak row refresh command and other (e.g., $1^{st}$-n-1th) refresh commands may correspond to regular row refresh commands (or strong row refresh commands). The peripheral circuitry 164 may determine that the refresh command 108 is a weak row refresh command in response to determining that the counter 170 has a particular value (e.g., 0). The peripheral circuitry 164 may determine that the refresh command 108 is a regular row refresh command (or a strong row refresh command) in response to determining that the counter 170 has another value (e.g., a positive value). The peripheral circuitry 164 may update (e.g., increment by 1 modulo n) the counter 170 subsequent to or prior to determining whether the refresh command 108 is a weak row refresh command.

In response to receiving (or generating) each regular row refresh command, the peripheral circuitry 164 may update consecutive rows of the rows 120, the rows 184, or both, based on an index value 118 indicated by the CBR blocks 104, as described with reference to FIG. 3. In response to receiving each weak row refresh command (or each strong row refresh command), the peripheral circuitry 164 may group a plurality of word lines (e.g., the first word line 134 and the second word line 136) onto a single refresh address (e.g., a refresh address 172 or a second refresh address) and may perform a refresh of the refresh address 172, as described with reference to FIG. 3. For example, the peripheral circuitry 164 may map the refresh address to word line addresses based on data stored in the OTP memory 102, as described with reference to FIG. 5. The word line addresses may identify word lines coupled to rows of storage elements. The rows of storage elements may have distinct bank offsets. The peripheral circuitry 164 may perform a refresh of the refresh address by refreshing each of the rows of storage elements. For example, the peripheral circuitry 164 may read data from each row of the rows of storage elements, and write the data to the row.

The system 100 may enable use of a single refresh address to perform a memory refresh of a plurality of weak rows having distinct bank offsets. For example, a plurality of word lines may be grouped onto the single refresh address. The plurality of word lines may be coupled to a plurality of weak rows having distinct bank offsets. A refresh of the single refresh address may be performed by refreshing each of the plurality of weak rows.

Figure 2A:
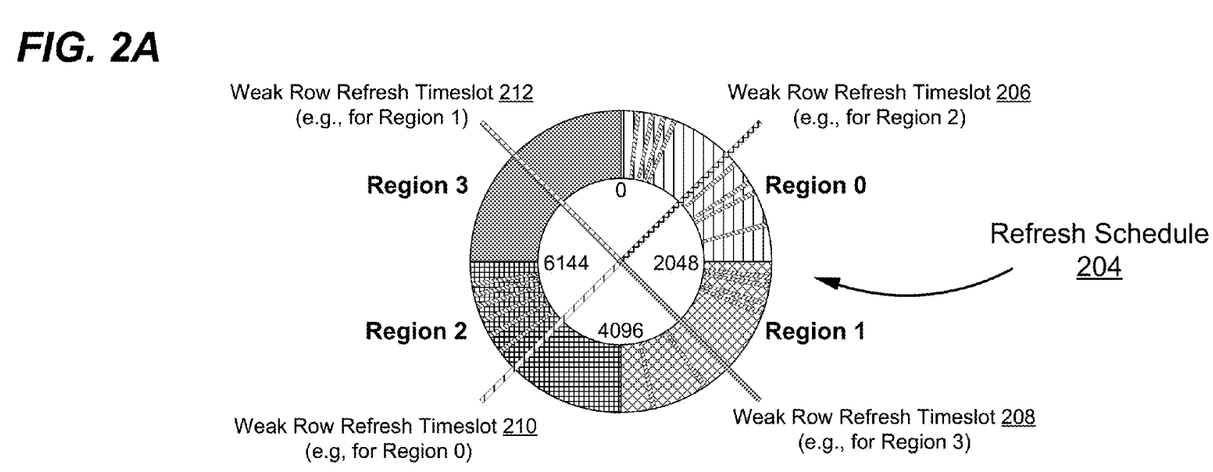
FIG. 2A is a diagram of a particular example of a refresh schedule.

Referring to FIG. 2A, a diagram of a particular example of a refresh schedule 204 is shown. In a particular aspect, the peripheral circuitry 164 may determine whether the refresh command 108 of FIG. 1 is a weak row refresh command or a regular row refresh command based on the refresh schedule 204, as described herein.

The memory array of FIG. 1 may be divided in a plurality of regions (e.g., regions 0-3) across a plurality of memory banks, as described with reference to FIG. 3. The refresh schedule 204 may include a first number (e.g., 8192 (8K)) of regular row refresh timeslots and a second number (e.g., 512) of weak row refresh timeslots. The first number of regular row refresh timeslots may be divided among the regions. For example, the refresh schedule 204 may include 0-2047 regular row refresh timeslots corresponding to Region 0, may include 2048-4095 regular row refresh timeslots corresponding to Region 1, may include 4096-6143 regular row refresh timeslots corresponding to Region 2, may include 6144-8191 regular row refresh timeslots corresponding to Region 3, or a combination thereof.

In the refresh schedule 204, the regular row refresh timeslots of a particular region may be interspersed with weak row refresh timeslots corresponding to another region. For example, the regular row refresh timeslots 0-2047 of Region 0 may be interspersed with weak row refresh timeslots (e.g., a weak row refresh timeslot 206) corresponding to Region 2, the regular row refresh timeslots 2048-4095 of Region 1 may be interspersed with weak row refresh timeslots (e.g., a weak row refresh timeslot 208) corresponding to Region 3, the regular row refresh timeslots 4096-6143 of Region 2 may be interspersed with weak row refresh timeslots (e.g., a weak row refresh timeslot 210) corresponding to Region 0, the regular row refresh timeslots 6144-8191 of Region 3 may be interspersed with weak row refresh timeslots (e.g., a weak row refresh timeslot 212) corresponding to Region 1, or a combination thereof.

The peripheral circuitry 164 may identify a refresh timeslot of the refresh schedule 204 that corresponds to the refresh command 108 based on the counter 170. For example, a particular value of the counter 170 may correspond to a particular timeslot of the refresh schedule 204. The peripheral circuitry 164 may determine whether the refresh command 108 corresponds to a regular row refresh or a weak row refresh based on whether the refresh timeslot corresponds to a regular row refresh timeslot or a weak row refresh timeslot. The peripheral circuitry 164 may perform a regular row refresh based on the index value 118 indicated by the CBR blocks 104, as described with reference to FIG. 3, in response to determining that the refresh timeslot corresponds to a regular row refresh timeslot (e.g., one of the regular row refresh timeslots 0-8191). The peripheral circuitry 164 may perform a weak row refresh based on the refresh address 172, as described with reference to FIG. 3, in response to determining that the refresh timeslot corresponds to a weak row refresh timeslot (e.g., one of the weak row refresh timeslots 206-212).

In a particular example, a first refresh schedule may include weak row refresh timeslots and a second refresh schedule may include strong row refresh timeslots. For example, a "strong" row refresh timeslot may correspond to a refresh of a strong row of storage elements. Each storage element of a strong row of storage elements may have a data retention time that satisfies a threshold retention time. The peripheral circuitry 164 may determine whether the refresh command corresponds to a weak row refresh command or a strong row refresh command based on the counter 170, as described with respect to FIG. 1. The peripheral circuitry 164 may perform a refresh based on the first refresh schedule in response to determining that the refresh command corresponds to a weak row refresh command. Alternatively, the peripheral circuitry 164 may perform a refresh based on the second refresh schedule in response to determining that the refresh command corresponds to a strong row refresh command. The first refresh schedule may be independent of the second refresh schedule. The peripheral circuitry 164 may perform a refresh of the refresh address 172 based on the first refresh schedule and may perform a refresh of a second refresh address based on the second refresh schedule. The second refresh address may map to word line addresses of strong rows, as described with reference to FIG. 1. In a particular example, a first refresh rate of the refresh address 172 may be substantially twice a second refresh rate of the second refresh address. For example, a first interval between a first weak row refresh and a next weak row refresh may be approximately half of a second interval between a first strong row refresh and a next strong row refresh.

The refresh schedule 204 may reduce an interval between refresh of the weak rows. For example, a particular weak row (e.g., the first row 124 of FIG. 1) of a particular region (e.g., Region 0) may be refreshed based on a regular row refresh timeslot (e.g., one of the regular row refresh timeslots 0-2047) corresponding to the particular region (e.g., Region 0) and may be refreshed based on a weak row refresh timeslot (e.g., the weak row refresh timeslot 210) in between regular row refresh timeslots of another region (e.g., Region 2).

Figure 2B:
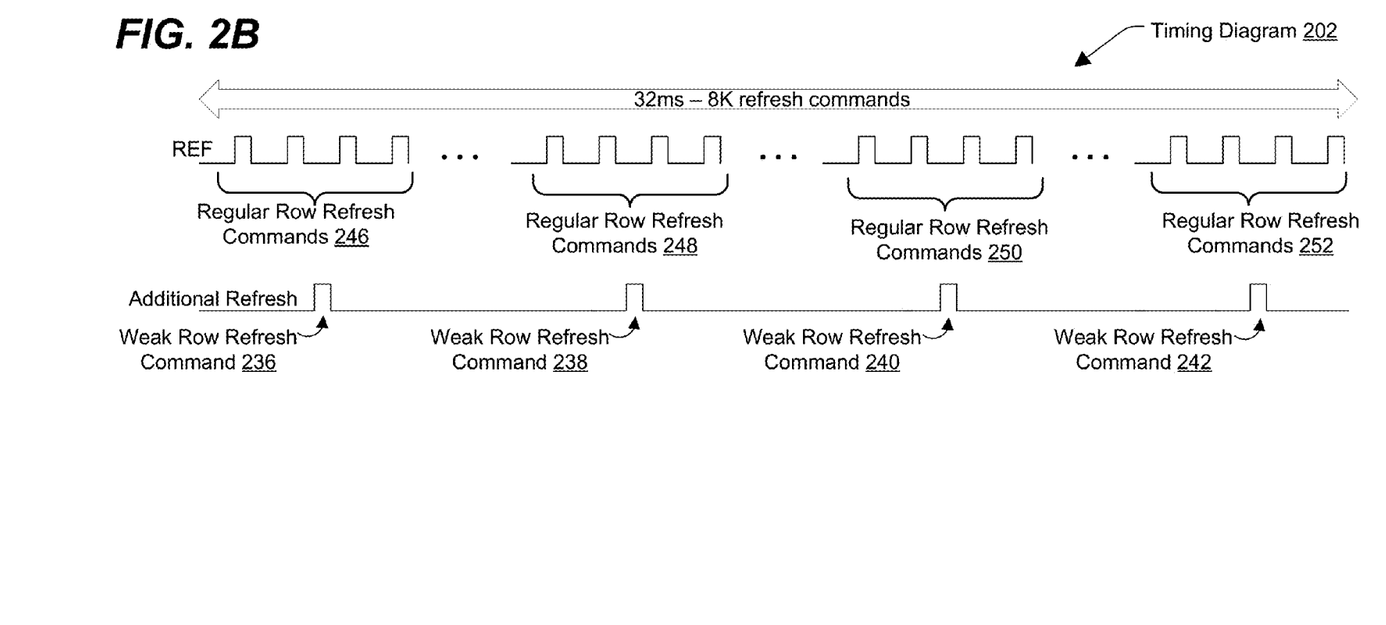
FIG. 2B is a timing diagram of a particular example of refresh commands corresponding to a refresh schedule.

Referring to FIG. 2B, a timing diagram of a particular example of refresh commands is shown and generally designated 202. The timing diagram 202 may correspond to a refresh schedule (e.g., the refresh schedule 204).

The refresh circuitry (e.g., the memory controller 166 or the peripheral circuitry 164) of FIG. 1 may generate regular row refresh commands (e.g., the refresh command 108) by asserting a first signal (REF). The regular row refresh commands may correspond to the refresh schedule 204. For example, the peripheral circuitry 164 may determine that regular row refresh commands 246 correspond to the regular row refresh timeslots 0-2047, may determine that regular row refresh commands 248 correspond to the regular row refresh timeslots 2048-4095, regular row refresh commands 250 correspond to the regular row refresh timeslots 4096-6143, regular row refresh commands 252 correspond to the regular row refresh timeslots 6144-8191, or a combination thereof.

The refresh circuitry (e.g., the memory controller 166 or the peripheral circuitry 164) may generate weak row refresh commands (e.g., the refresh command 108) by asserting a second signal (Additional Refresh). The weak row refresh commands may correspond to the refresh schedule 204. For example, the peripheral circuitry 164 may determine that a weak row refresh command 236 corresponds to the weak row refresh timeslot 206, a weak row refresh command 238 corresponds to the weak row refresh timeslot 208, a weak row refresh command 240 corresponds to the weak row refresh timeslot 210, a weak row refresh command 242 corresponds to the weak row refresh timeslot 212, or a combination thereof.

Refresh commands generated based on the timing diagram 202 may thus reduce an interval between refresh of the weak rows. For example, a particular weak row (e.g., the first row 124 of FIG. 1) of a particular region (e.g., Region 0) may be refreshed based on a regular row refresh command (e.g., one of the regular row refresh commands 246) corresponding to the particular region (e.g., Region 0) and may be refreshed based on a weak row refresh command (e.g., the weak row refresh command 240) generated in between regular row refresh commands of another region (e.g., Region 2).

Figure 3:
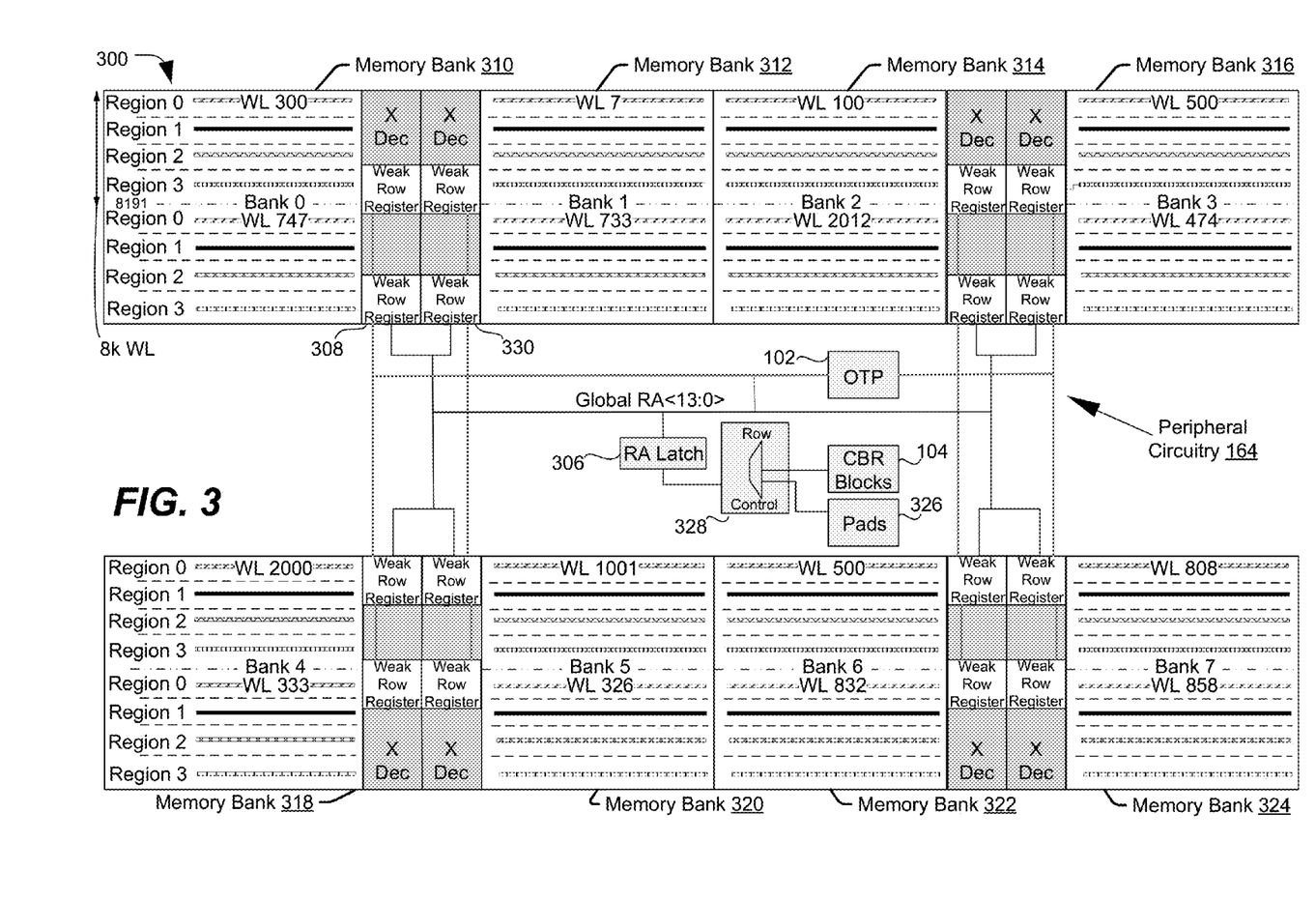
FIG. 3 is a diagram of a particular example of a system operable to refresh storage elements.

Referring to FIG. 3, a diagram of a particular example of a system operable to refresh storage elements is shown and generally designated 300. The system 300 may include one or more components of the system 100 of FIG. 1. For example, the system 300 may include the peripheral circuitry 164, a non-volatile memory (e.g., the OTP memory 102), the CBR blocks 104, or a combination thereof. In a particular implementation, the peripheral circuitry 164 may include the OTP memory 102, the CBR blocks 104, or both. The peripheral circuitry 164 may include a row address (RA) latch 306 coupled to the CBR blocks 104 via a multiplexer (MUX) 328. The MUX 328 may be coupled to pads 326.

The system 300 may include a memory array. The memory array may include a plurality of memory banks (e.g., memory banks 310, 312, 314, 316, 318, 320, 322, and 324). The memory banks 310-324 may include the first memory bank 180 and the second memory bank 182. Each memory bank includes a plurality of (e.g., 2) sections (e.g., Section 0 and Section 1). Each section may include a plurality of (e.g., 512) regions (e.g., Region 0, Region 1, Region 2, and Region 3). Each region includes a plurality of rows of storage elements.

A particular row of the memory array may be coupled to a corresponding word line. Each word line may have a particular word line address. A first portion (e.g., 3 most significant bits) of the particular word line address may indicate a particular memory bank (e.g., the memory bank 310, 312, 314, 316, 318, 320, 322, or 324) that includes a particular row of storage elements corresponding to the word line. A second portion (e.g., $4^{th}$-$17^{th}$ most significant bit) of the particular word line address may indicate a bank offset (e.g., row index) of the particular word line, the particular row, or both. For example, Region 0 of Section 0 of a particular memory bank may include rows (or word lines) with bank offsets starting from a first bank offset (e.g., 0) to a second bank offset (e.g., 2047). Each of the Regions 1-3 of Section 0 may include rows having consecutive bank offsets. Region 0 of Section 1 may include rows (or word lines) with bank offsets starting from a first bank offset (e.g., 8192) to a second bank offset (e.g., 10,239). Each of Regions 1-3 of Section 1 may include rows having consecutive bank offsets.

The system 300 includes a plurality of weak row registers (e.g., a weak row register 308 and a weak row register 330). A particular weak row register may correspond to a particular section. For example, the weak row register 308 may correspond to a particular section (e.g., Section 1) of the memory bank 310. As another example, the weak row register 330 may correspond to a particular section (e.g., Section 1) of the memory bank 312.

During a memory (e.g., a read/write) access to a particular storage element of the memory array, the peripheral circuitry 164 may provide an address of the particular storage element to the pads 326 and may provide a first control signal to the MUX 328. The particular storage element may be coupled to a particular word line and to a particular bit line. The address may indicate a word line address of the particular word line and a bit line address of the particular bit line. The MUX 328 may read the address from the pads 326 in response to the first control signal, may determine a section offset corresponding to the address, and may provide the section offset to the RA latch 306. The peripheral circuitry 164 may similarly determine a column address based on the address and may provide the column address to a column address latch. The peripheral circuitry 164 may activate a row strobe corresponding to a particular section (e.g., Section 0 or Section 1) of a particular memory bank (e.g., the memory bank 310, 312, 314, 316, 318, 320, 322, or 324). The peripheral circuitry 164 may activate a column strobe corresponding to the particular section of the particular memory bank. The peripheral circuitry 164 may read or write data (e.g., 0 or 1) to the particular storage element.

The peripheral circuitry 164 may receive (or generate) a regular row refresh command (e.g., the refresh command 108 of FIG. 1), as described with reference to FIG. 1. The CBR blocks 104 may store the index value 118 of FIG. 1 indicating a first section offset. For example, the first section offset may indicate a particular word line coupled to a particular row (e.g., row 0, row 100, row 2047, or row 8191) that is included in a first region (e.g., Region 0 or Region 3). The peripheral circuitry 164 may provide a second control signal to the MUX 328 in response to receiving (or generating) the regular row refresh command. The MUX 328 may load the index value 118 from the CBR blocks 104 to the RA latch 306 in response to the second control signal. The peripheral circuitry 164 may refresh the particular row corresponding to the first section offset indicated by the index value 118 in each section of the memory array. For example, the peripheral circuitry 164 may refresh a first row of a first section (e.g., Section 0) of each memory bank (e.g., the memory banks 310, 312, 314, 316, 318, 320, 322, and 324) and may refresh a second row of a second section (e.g., Section 1) of each memory bank (e.g., the memory banks 310, 312, 314, 316, 318, 320, 322, and 324). The first row may be coupled to a first word line and the second row may be coupled to a second word line. The first word line and the second word line may correspond to the same section offset (e.g., the particular section offset). Refreshing a row of storage elements (e.g., the first row 124 or the second row 126 of FIG. 1) may include reading data values from the row of storage elements and writing the data values back to the row of storage elements.

The peripheral circuitry 164 may update (e.g., modulo increment by 1) the CBR blocks 104 to indicate a second index value. The second index value may indicate a next word line coupled to a next row (e.g., row 1 or row 101) of the first region (e.g., Region 0) or a first word line coupled to a first row (e.g., row 2048 or row 0) of a next region (e.g., Region 1 or Region 0) to be refreshed in response to receiving a next regular row refresh command.

The peripheral circuitry 164 may receive (or generate) a weak row refresh command (e.g., the refresh command 108 of FIG. 1), as described with reference to FIG. 1. The OTP memory 102 may include data that maps the refresh address 172 to the word line addresses 116, as described with reference to FIG. 5. A first word line address of the word line addresses 116 may correspond to a first word line coupled to a first row (e.g., row 0) of a first section (e.g., Section 1) of the memory bank 310. A second word line address of the word line addresses 116 may correspond to a second word line coupled to a second row (e.g., row 0 or row 3000) of a second section (e.g., Section 0) of the memory bank 310. Additionally, or in the alternative, a third word line address of the word line addresses 116 may correspond to a third word line coupled to a third row (e.g., row 0, row 1102, row 2056, row 3000, or row 8000) of a particular section (e.g., Section 0 or Section 1) of another memory bank (e.g., the memory bank 312). Each of the first word line, the second word line, and the third word line may be coupled to at least one corresponding weak storage element.

In a particular example, the first word line address, the second word line address, and the third word line address may correspond to the same bank offset (e.g., row 0). In an alternate example, at least two of the first word line address, the second word line address, and the third word line address may correspond to distinct bank offsets. The first word line address may correspond to a first region (e.g., Region 0, 1, 2, or 3) of the first section (e.g., Section 1) of the memory bank 310. The second word line address may correspond to a second region (e.g., Region 0, 1, 2, or 3) of the second section (e.g., Section 0) of the memory bank 310. The third word line address may correspond to a third region (e.g., Region 0, 1, 2, or 3) of the particular section (e.g., Section 0 or Section 1) of the memory bank 312.

In a particular example, the first word line address, the second word line address, or the third word line address may correspond to the same region. For example, the first word line address may correspond to Region 0 of the first section of the memory bank 310, the second word line address may correspond to Region 0 of the second section of the memory bank 310, and the third word line address may correspond to Region 0 of the particular section of the memory bank 312.

In an alternate example, at least two of the first word line address, the second word line address, or the third word line address may correspond to distinct regions. For example, the first word line address may correspond to Region 0 of the first section of the memory bank 310, the second word line address may correspond to Region 2 of the second section of the memory bank 310, and the third word line address may correspond to Region 3 of the particular section of the memory bank 312.

The peripheral circuitry 164 may group the first word line, the second word line, and the third word line onto the refresh address 172. For example, the peripheral circuitry 164 may map the refresh address 172 to the word line addresses 116 based on data stored in the OTP memory 102, as described with reference to FIG. 5. To illustrate, the OTP memory 102 may include a bank OTP memory corresponding to each memory bank (e.g., the memory bank 310 and the memory bank 312), as described with reference to FIG. 5. The peripheral circuitry 164 may determine one or more indices based on the refresh address 172, as described with reference to FIG. 5. The peripheral circuitry 164 may map the indices to entries of each bank OTP memory. A particular entry of a bank OTP memory may include entry data indicating a particular word line address of the word line addresses 116. The peripheral circuitry 164 may map the refresh address 172 to the word line addresses 116 based on entry data of entries of each bank OTP memory that correspond to the one or more indices.

The peripheral circuitry 164 may sequentially write the word line addresses 116 or portions thereof to corresponding weak row registers. For example, the peripheral circuitry 164 may determine a first memory bank (e.g., the memory bank 310) based on a first portion (e.g., 3 most signification bits) of the first word line address. A first bank offset of the first word line may correspond to a second portion (e.g., $4^{th}$-$17^{th}$ most significant bits) of the first word line address. The peripheral circuitry 164 may determine a first section (e.g., Section 1) based on a third portion (e.g., $4^{th}$ most significant bit) of the first word line address. The peripheral circuitry 164 may determine a first section offset based on a fourth portion (e.g., $5^{th}$-$17^{th}$ most significant bits) of the first word line address.

The peripheral circuitry 164 may write the first section offset to a weak row register corresponding to the first section of the first memory bank. For example, the peripheral circuitry 164 may write the first section offset to the weak row register 308 corresponding to the first section (e.g., Section 1) of the memory bank 310.

The peripheral circuitry 164 may similarly write a second section offset based on the second word line address of the word line addresses 116 to a corresponding weak row register. The peripheral circuitry 164 may write a third section offset based on the third word line address of the word line addresses 116 to a corresponding weak row register. In a particular example, the peripheral circuitry 164 may write section offsets to weak row registers corresponding to each section of each of the memory banks 310, 312, 314, 316, 318, 320, 322, and 324.

In a particular example, the peripheral circuitry 164 may write the section offsets to the corresponding weak row registers prior to receiving the weak row refresh command. For example, the peripheral circuitry 164 may write the section offsets to the corresponding weak row registers subsequent to refreshing storage elements corresponding to a previously received refresh command (e.g., a previously received weak row refresh command or a previously received regular row refresh command). The peripheral circuitry 164 may, in response to receiving the weak row refresh command, refresh rows of storage elements coupled to word lines indicated by the section offsets in the weak row registers. The peripheral circuitry 164 may update (e.g., modulo increment by 1) the refresh address 172 (e.g., the OTP index) to indicate a next group of word line addresses to be read from the OTP memory 102. For example, the peripheral circuitry 164 may determine a value of the refresh address 172 based on a value of a particular counter and may update (e.g., modulo increment by 1) the value of the particular counter subsequent to determining the value of the refresh address 172. The OTP memory 102 may include data that maps an updated value of the refresh address 172 to the next group of word line addresses, as described with reference to FIG. 5.

The peripheral circuitry 164 may refresh each of the word lines (e.g., the first word line, the second word line, and the third word line) corresponding to the word line addresses 116 at a same time interval. For example, a duration between consecutive refreshes of each of the word lines (e.g., the first word line, the second word line, and the third word line) may be the same. To illustrate, the refresh address 172 may have a first value at a time t1. After a number of updates to the refresh address 172 during a particular time interval, the refresh address 172 may cycle back to the first value. The first value may map to the word line addresses 116. Each of the word lines (e.g., the first word line, the second word line, and the third word line) corresponding to the word line addresses 116 may be refreshed in response to the refresh address 172 having the first value at the particular time interval.

The system 300 may thus enable a memory refresh of a plurality of weak rows in response to a weak row refresh command. Thus, weak storage elements of the weak rows may be refreshed at a higher frequency than other storage elements. For example, a particular weak row may be refreshed in response to a corresponding regular row refresh command and in response to a corresponding weak row refresh command. A plurality of weak rows having distinct bank offsets may be grouped onto a single refresh address. Rows having distinct bank offsets may be refreshed in response to a weak row refresh command.

Figure 4:
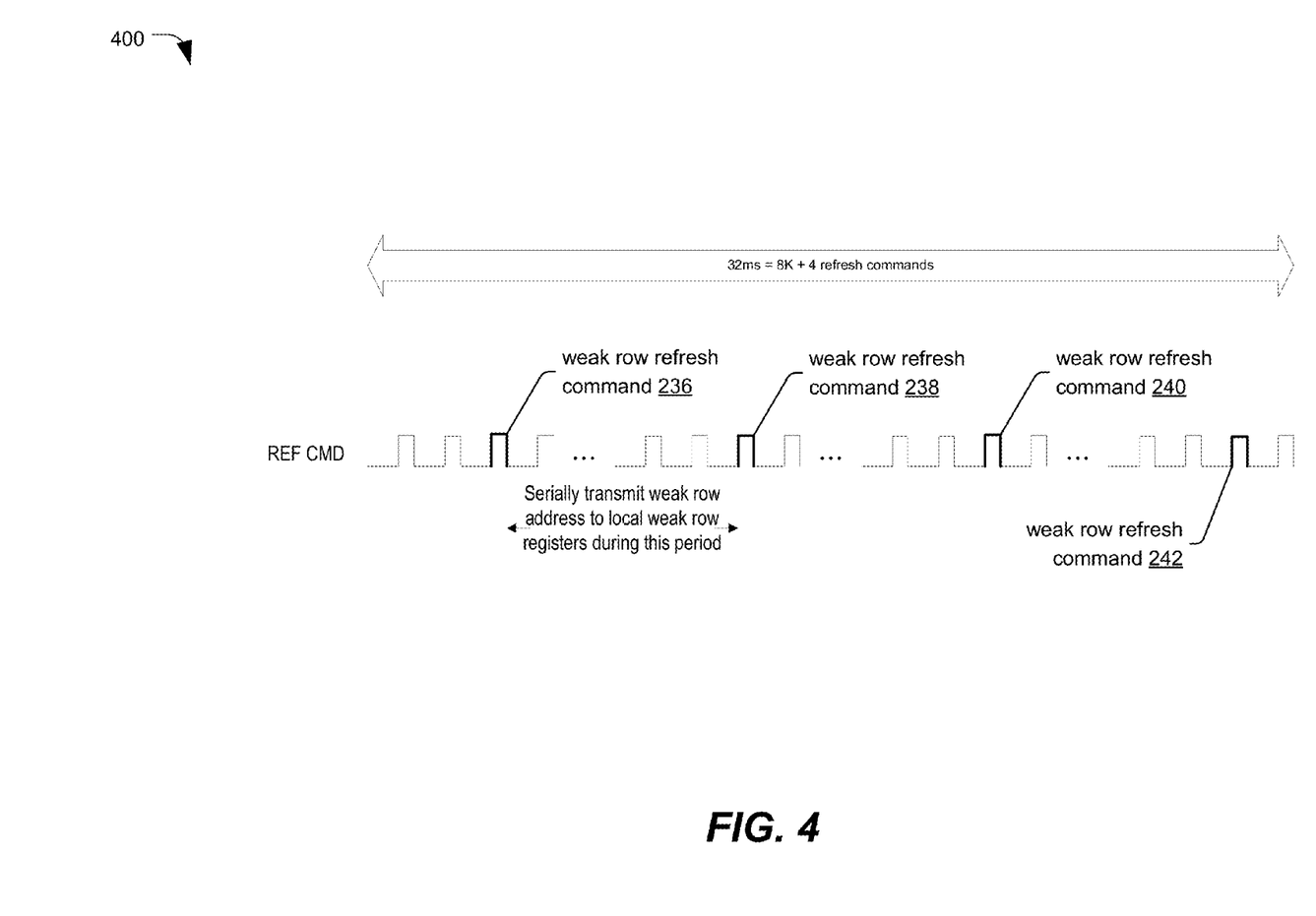
FIG. 4 is a timing diagram of a particular example of refresh commands.

Referring to FIG. 4, a timing diagram of a particular example of refresh commands is shown and generally designated 400. In a particular example, the timing diagram 400 may correspond to the refresh schedule 204 of FIG. 2.

The refresh circuitry (e.g., the memory controller 166 or the peripheral circuitry 164) of FIG. 1 may assert a first signal (REF CMD) to generate refresh commands. For example, every nth refresh command may be a weak row refresh command and other refresh commands (e.g., $1^{st}$-n-1th) may be regular row refresh commands, as described with reference to FIG. 1. The timing diagram 400 indicates that regular row refresh commands are interleaved with weak row refresh commands 236, 238, 240, and 242.

The peripheral circuitry 164 may write section offsets to corresponding weak row registers subsequent to receiving a first weak row refresh command (e.g., the weak row refresh command 236) and prior to receiving a subsequent weak row refresh command (e.g., the weak row refresh command 238). Writing the bank offsets to the weak row registers prior to receiving a corresponding weak row refresh command may result in a faster weak row refresh. As a result, a refresh interval during which portions of the memory (e.g., the weak rows) are unavailable for a memory (e.g., a ready or write) access may be shorter.

Figure 5:
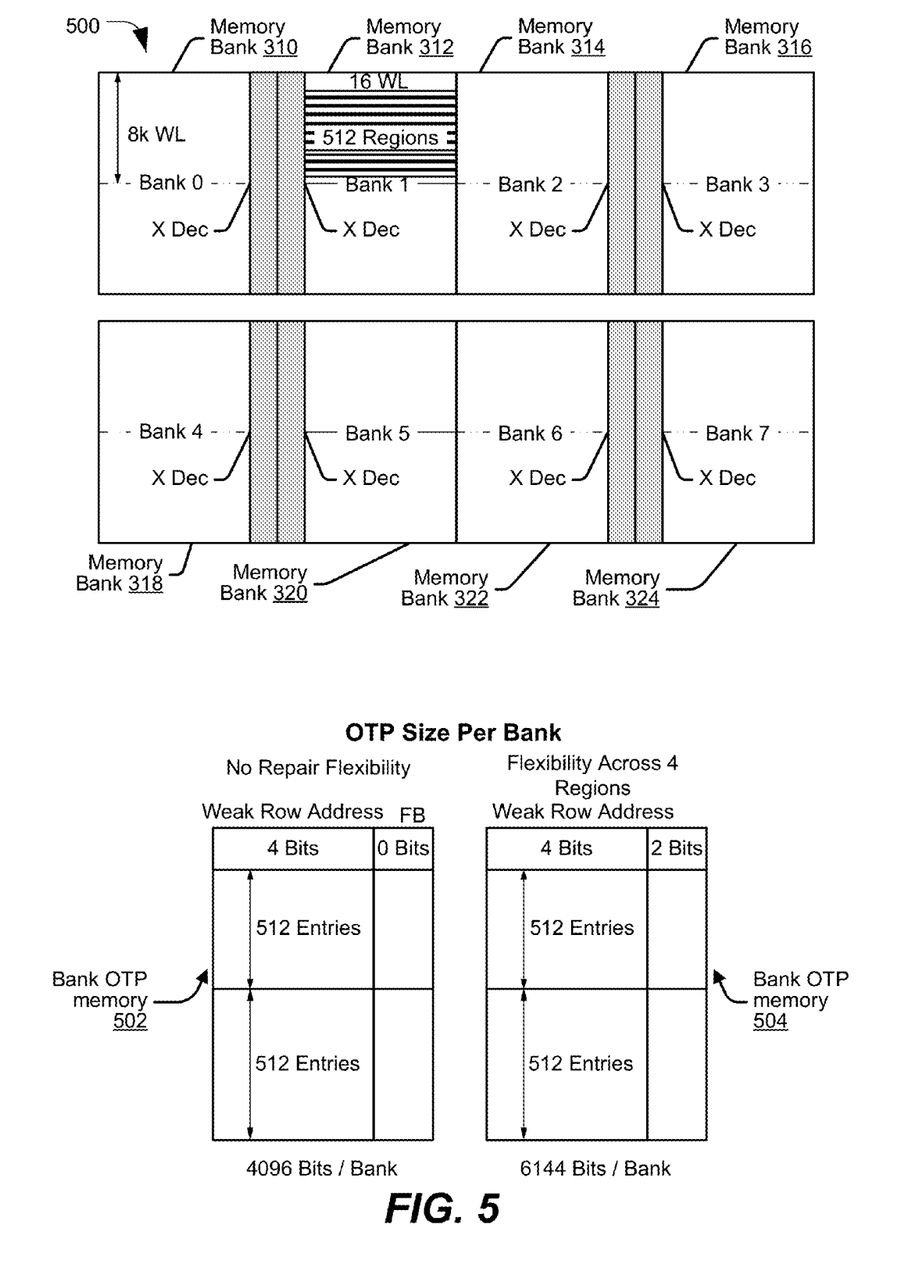
FIG. 5 is a diagram of a particular example of a system operable to refresh storage elements.

Referring to FIG. 5, a diagram of a particular example of a system operable to refresh storage elements is shown and generally designated 500. In a particular example, the system 500 may include one or more components of the system 100 of FIG. 1, one or more components of the system 300 of FIG. 3, or a combination thereof. In FIG. 5, the system 500 includes the memory banks 310, 312, 314, 316, 318, 320, 322, and 324.

Each of the memory banks 310, 312, 314, 316, 318, 320, 322, and 324 includes a plurality of sections (e.g., Section 0 and Section 1). Each section includes a first number (e.g., 8192) of rows formed of a second number (e.g., 512) of regions with a particular number (e.g., 16) of rows each.

The OTP memory 102 of FIG. 1 may include a bank OTP memory corresponding to each memory bank. For example, the OTP memory 102 may include a first bank OTP memory corresponding to the memory bank 310 of FIG. 3, a second bank OTP memory corresponding to the memory bank 312, and so on. To illustrate, the OTP memory 102 includes a bank OTP memory 502 that is associated with the memory bank 310. The bank OTP memory 502 may include a first set of entries corresponding to a first section (e.g., Section 0) of the memory bank 310 and a second set of entries corresponding to a second section (e.g., Section 1) of the memory bank 310. The first set of entries and the second set of entries may each include a first number (e.g., 512) of entries. The first set of entries may include a subset of entries (e.g., a single entry) corresponding to each region of the first section of the memory bank 310. Each entry may indicate a word line address of a particular word line coupled to a weak row of a corresponding region of the memory bank 310.

The OTP memory 102 of FIG. 1 may include data that maps the refresh address 172 of FIG. 1 to a plurality of word line addresses. For example, the refresh address 172 may correspond to one or more entry indices of each of the bank OTP memories (e.g., the bank OTP memory 502).

During operation, the peripheral circuitry 164 may sequentially read entries from each of the bank OTP memories associated with each of the memory banks 310, 312, 314, 316, 318, 320, 322, and 324. For example, when the refresh address 172 has a particular value (e.g., 0), the peripheral circuitry 164 may read a first entry (e.g., entry 0) and a second entry (e.g., entry 512) from each of the bank OTP memories based on the counter. To illustrate, the peripheral circuitry 164 may determine a first entry index (e.g., value of the refresh address 172) and a second entry index (e.g., 512+value of the refresh address 172) based on the refresh address 172. The peripheral circuitry 164 reads, from a particular bank OTP memory, first entry data corresponding to the first entry index (e.g., entry 0) and second entry data corresponding to the second entry index (e.g., entry 512). The peripheral circuitry 164 may determine a first bank offset of a first word line based on the first entry data, as described herein.

A first word line address of the first word line may include a first portion indicating the memory bank 310, a second portion indicating the first section (e.g., Section 0), a third portion indicating a first region (e.g., Region 3), and a fourth portion indicating a first region offset (e.g., a value between 0-15). The second portion, the third portion, and the fourth portion may indicate a first bank offset (e.g., a value between 0-16,383) of the first word line. The third portion and the fourth portion may indicate a first section offset (e.g., a value between 0-8,191). The peripheral circuitry 164 may determine the first portion of the first word line address in response to determining that the first entry data is retrieved from the bank OTP memory corresponding to the memory bank 310. The peripheral circuitry 164 may determine the second portion and the third portion of the first word line address based on the first entry index. The peripheral circuitry 164 may determine the fourth portion of the first word line address based on the first entry data. The peripheral circuitry 164 may determine the first section offset by concatenating the third portion and the fourth portion. The peripheral circuitry 164 may write the first section offset to a weak row register corresponding to the first section (e.g., Section 0) of the memory bank 310.

The peripheral circuitry 164 may read the second entry data from a second entry (e.g., entry 512) of the bank OTP memory 502. The peripheral circuitry 164 may write a second section offset corresponding to the second entry data to the weak row register 308 of FIG. 3 corresponding to the second section (e.g., Section 1) of the memory bank 310.

Similarly, the peripheral circuitry 164 may read first entry data from a first entry of a memory bank corresponding to one or more of the other memory banks (e.g., the memory bank 312). The peripheral circuitry 164 may write a first section offset corresponding to the first entry data to a weak row register corresponding to the first section (e.g., Section 0) of the one or more of the other memory banks. The peripheral circuitry 164 may read second entry data from a second entry of the second bank OTP memory, and may write a second section offset corresponding to the second entry data to the weak row register of the one or more of the other memory banks.

The peripheral circuitry 164 may perform a refresh of the refresh address 172. For example, the peripheral circuitry 164 may refresh a first set of rows of storage elements corresponding to a first set of word lines of a first memory bank (e.g., the memory bank 310). To illustrate, the peripheral circuitry 164 may refresh a first row (e.g., the first row 124 of FIG. 1) corresponding to the first section offset stored in the weak row register associated with Section 0 of the memory bank 310. The peripheral circuitry 164 may refresh a second row (e.g., the second row 126 of FIG. 1) corresponding to the second section offset stored in the weak row register 308 associated with Section 1 of the memory bank 310. Similarly, the peripheral circuitry 164 may refresh second rows of storage elements corresponding to a second set of word lines of a second memory bank (e.g., the memory bank 312). The peripheral circuitry 164 may refresh a first row (e.g., the first row 124 of FIG. 1) corresponding to the first section offset stored in the weak row register associated with Section 0 of the memory bank 312. The peripheral circuitry 164 may refresh a second row (e.g., the second row 126 of FIG. 1) corresponding to the second section offset stored in the weak row register 330 associated with Section 1 of the memory bank 312. In a particular example, a first word line of the first set of word lines of the memory bank 310 may have a first bank offset. The second set of word lines of the memory bank 312 may exclude a second word line having the first bank offset. The first word line may be coupled to a first row of the memory bank 310 and the second word line may be coupled to a second row of the memory bank 312. The peripheral circuitry 164 may, when performing a refresh of the refresh address 172, refresh the first set of rows of the memory bank 310 that includes the first row and may refresh the second set of rows of the memory bank 312 that excludes the second row.

A particular region (e.g., Region 3) of a particular section (e.g., Section 0) of a particular memory bank (e.g., the memory bank 310) may include a first number of weak rows. A corresponding bank OTP memory (e.g., the bank OTP memory 502) may have a second number of entries corresponding to Region 3 of Section 0. In a particular example, the first number of weak rows may be distinct from the second number of entries. If the first number of weak rows is fewer than the second number of entries, one or more entries of the bank OTP memory 502 corresponding to Region 3 of Section 0 may include addresses of regular rows (e.g., rows that include no weak storage elements).

If the first number of weak rows is greater than the second number of entries, one or more of the weak rows may not be included in the entries of the bank OTP memory 502 corresponding to Region 3 of Section 0. Alternately, a bank OTP memory may include additional bits to accommodate such circumstances.

For example, the bank OTP memory 504 illustrates a bank OTP memory that includes additional bits for each entry. The additional bits may indicate a region associated with an entry. For example, the bank OTP memory 504 may include multiple (e.g., two) entries associated with a particular region (e.g., Region 2 of Section 0 of the memory bank 310). In a particular example, the bank OTP memory 504 may include no entries associated with a particular region (e.g., Region 3 of Section 0 of the memory bank 310). In this example, the peripheral circuitry 164 may read the additional bits corresponding to a particular entry from the bank OTP memory 504. The peripheral circuitry 164 may determine a second portion of a word line address indicating a section based on an entry index of the particular entry and may determine a third portion of the word line address indicating a region based on the additional bits. The peripheral circuitry 164 may generate a first section offset by concatenating the additional bits (e.g., the third portion) and entry data of the particular entry.

The bank OTP memory 502 may have a smaller size (e.g., 4 bits*1024 entries=4096 bits) than the bank OTP memory 504 (e.g., 6 bits*1024 entries=6144 bits). In a particular example, the OTP memory 102 may include the bank OTP memory 502 corresponding to each of the memory banks 310, 312, 314, 316, 318, 320, 322, and 324. In this example, the OTP memory 102 may have a first size (e.g., 4096*8=32,768 bits). In an alternate example, the OTP memory 102 may include the bank OTP memory 504 corresponding to each of the memory banks 310, 312, 314, 316, 318, 320, 322, and 324. In this example, the OTP memory 102 may have a second size (e.g., 6144*8=49,152 bits). The first size may be smaller than the second size.

The bank OTP memory 504 may provide greater flexibility than the bank OTP memory 502. For example, a particular entry of the bank OTP memory 504 may correspond to one of multiple regions, whereas a particular entry of the bank OTP memory 502 may correspond to a single region.

Figure 6:
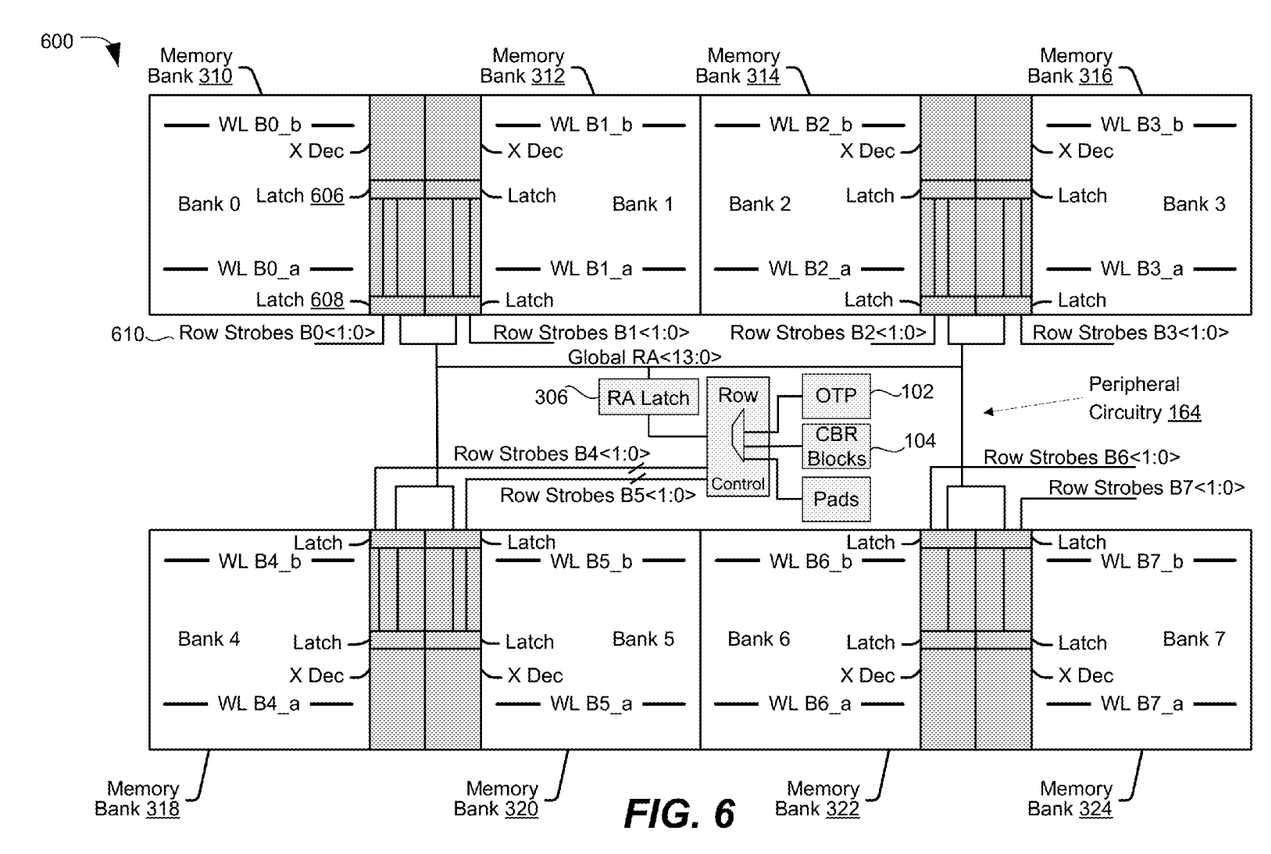
FIG. 6 is a diagram of a particular example of a system operable to refresh storage elements.

Referring to FIG. 6, a diagram of a particular example of a system operable to refresh storage elements is shown and generally designated 600. The system 600 may include one or more components of the system 100 of FIG. 1, one or more components of the system 300 of FIG. 3, one or more components of the system 500 of FIG. 5, or a combination thereof.

The system 600 may include a plurality of latches (e.g., latch 606, latch 608, etc.). Each latch may correspond to a particular section of a particular bank of the plurality of memory banks. For example, the latch 608 may correspond to a particular section (e.g., Section 1) of the memory bank 310.

The peripheral circuitry 164 may sequentially read entry data from the OTP memory 102 and determine section offsets based on the entry data, as described with reference to FIG. 5. The peripheral circuitry 164 may load the section offsets to the RA latch 306 in response to receiving a weak row refresh command (e.g., the refresh command 108 of FIG. 1). The peripheral circuitry 164 may, after loading each of the section offsets, activate a corresponding row strobe to latch the section offset in a corresponding latch. For example, the peripheral circuitry 164 may, in response to receiving a first weak row refresh command, read first entry data from the OTP memory 102, determine a first section offset based on the first entry data, and load the first section offset to the RA latch 306. The first section offset may correspond to a particular section (e.g., Section 1) of a particular memory bank (e.g., the memory bank 310). The peripheral circuitry 164 may activate a row strobe 610 corresponding to the particular section (e.g., Section 1) of the particular memory bank (e.g., the memory bank 310) to latch the first section offset in a latch 608. The peripheral circuitry 164 may load a second section offset to the RA latch 306. The second section offset may correspond to another section (e.g., Section 0) of the particular memory bank (e.g., the memory bank 310) or may correspond to a section (e.g., Section 0 or Section 1) of another memory bank (e.g., the memory bank 312, 314, 316, 318, 320, 322, or 324). The peripheral circuitry 164 may activate another row strobe to latch the second section offset in a corresponding latch. The first section offset may indicate a first row (e.g., row 0) and a first region (e.g., Region 0). The second section offset may indicate a second row (e.g., row 0 or row 1) and the first region (e.g., Region 0). The peripheral circuitry 164 may refresh a row of storage elements corresponding to the first section offset subsequent to latching the first section offset. For example, the peripheral circuitry 164 may refresh the first row (e.g., row 0) of the first region (e.g., Region 0) in the particular section (e.g., Section 1) of the particular memory bank (e.g., the memory bank 310). To illustrate, the peripheral circuitry 164 may read values from the first row of storage elements and write back the values to the first row of storage elements.

In a particular example, the peripheral circuitry 164 may refresh rows in different regions in response to a weak row refresh command (e.g., the refresh command 108), as described with reference to FIG. 5. For example, the peripheral circuitry 164 may refresh a first row in a first region (e.g., Region 0) of a first section (e.g., Section 0) of a first memory bank (e.g., the memory bank 310) and a second row in a second region (e.g., Region 1) of a second section (e.g., Section 1) of the first memory bank (e.g., the memory bank 310). The first region (e.g., Region 0) and the second region (e.g., Region 1) may be proximate (e.g., next) to each other.

The system 600 may thus enable a memory refresh of a plurality of weak rows in response to a weak row refresh command. Weak storage elements of the weak rows may be refreshed at a higher frequency than other storage elements. For example, a particular weak row may be refreshed in response to a corresponding regular row refresh command and in response to a corresponding weak row refresh command. Rows having distinct bank offsets, distinct regions, or both, may be refreshed in response to a weak row refresh command.

Figure 7:
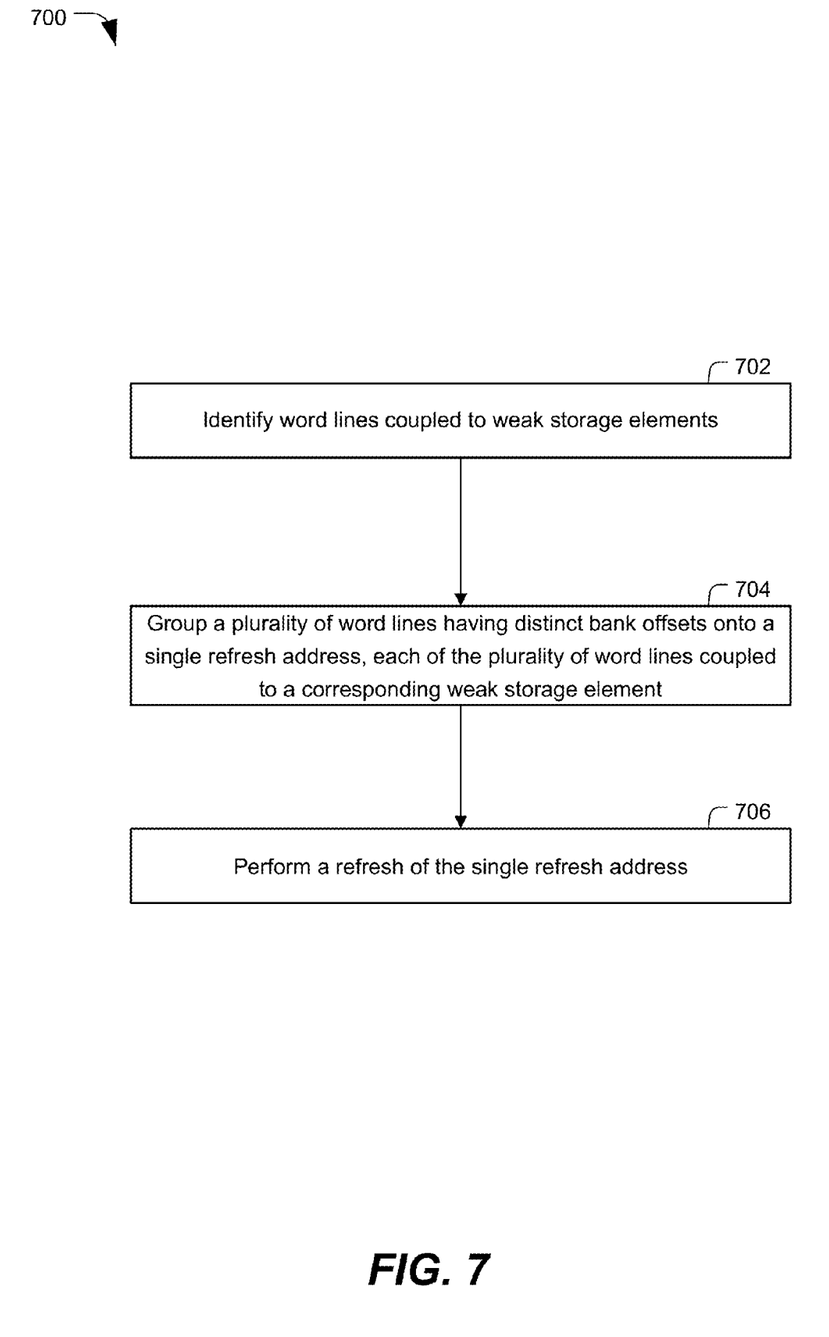
FIG. 7 is a flow chart of a particular illustrative example of a method of refreshing storage elements.

Referring to FIG. 7, a flow chart of a particular example of a method of refreshing storage elements is shown and generally designated 700. In a particular example, one or more operations of the method 700 may be performed by the system 100 of FIG. 1, the system 300 of FIG. 3, the system 600 of FIG. 6, or a combination thereof.

The method 700 includes identifying word lines coupled to weak storage elements, at 702. For example, the OTP memory 102 may include data indicating the word line addresses 116 of word lines coupled to weak storage elements, as described with reference to FIG. 1.

The method 700 also includes grouping a plurality of word lines having distinct bank offsets onto a single refresh address, at 704. Each of the plurality of word lines may be coupled to a corresponding weak storage element. For example, the peripheral circuitry 164 of FIG. 1 may group a plurality of word lines having distinct bank offsets onto the refresh address 172 by mapping the refresh address 172 to the word line addresses 116 corresponding to the plurality of word lines, as described with reference to FIGS. 1 and 5.

The method 700 further includes performing a refresh of the single refresh address, at 706. For example, the peripheral circuitry 164 of FIG. 1 may refresh the refresh address 172 by refreshing rows of storage elements corresponding to the word line addresses 116, as described with reference to FIGS. 1 and 5. For example, the rows of storage elements may be coupled to word lines corresponding to the word line addresses 116. The peripheral circuitry 164 may refresh the refresh address 172 by refreshing each of the rows of storage elements. For example, the peripheral circuitry 164 may refresh each of the row of storage elements by reading data values from the row of storage elements and writing the data values to the row of storage elements.

The method 700 may thus enable weak storage elements of weak rows to be refreshed more frequently than other storage elements. For example, a particular weak row may be refreshed in response to a corresponding regular row refresh command and in response to a corresponding weak row refresh command. Rows having distinct bank offsets may be refreshed in response to a weak row refresh command. For example, a refresh address may be determined in response to the weak row refresh command. The refresh address may map to word line addresses of word lines coupled to rows of storage elements. The rows of storage elements may have distinct bank offsets. A refresh of the refresh address may be performed by refreshing each of the rows of storage elements.

The method of FIG. 7 may be implemented by a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, the method of FIG. 7 can be performed by a processor that executes instructions, as described with respect to FIG. 8.

Figure 8:
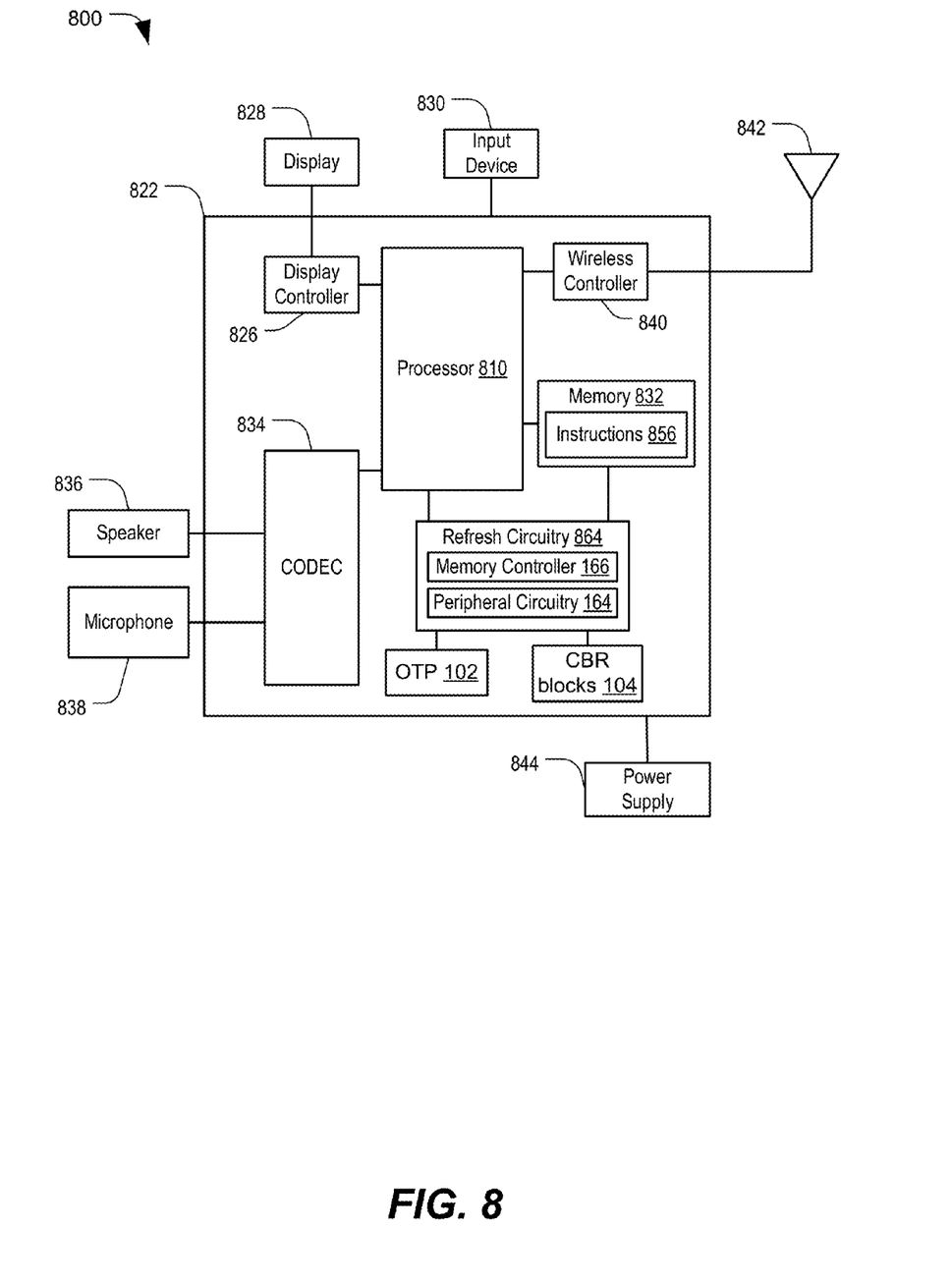
FIG. 8 is a block diagram of a device operable to refresh storage elements.

Referring to FIG. 8, a block diagram of a particular illustrative example of a wireless communication device is depicted and generally designated 800. The device 800 includes a processor 810 (e.g., a digital signal processor (DSP)) coupled to a memory 832. The memory 832 may include the first memory bank 180, the second memory bank 182 of FIG. 1, one or more of the memory banks 310-324 of FIG. 3, or a combination thereof. The processor 810, the memory 832, or both, may be coupled to refresh circuitry 864. The refresh circuitry 864 may include the memory controller 166, the peripheral circuitry 164, or both. The refresh circuitry 864 may be coupled to the OTP memory 102, the CBR blocks 104, or both. In a particular example, the peripheral circuitry 164 may include the OTP memory 102, the CBR blocks 104, or both. In a particular example, one or more components of the device 800 may perform one or more operations described with reference to systems and methods of FIGS. 1-7.

The refresh circuitry 864 may be coupled to the memory 832 to enable memory refresh by an off-chip refresh process. Alternatively, the refresh circuitry 864 may be implemented on-chip, such as via the processor 810. For example, the memory 832 may be a non-transient computer readable medium storing computer-executable instructions 856 that are executable by the processor 810 to cause the processor 810 to refresh storage elements of the memory 832 by generating refresh commands to refresh rows of storage elements based on a refresh schedule (e.g., the refresh schedule 204 of FIG. 1).

FIG. 8 also shows a display controller 826 that is coupled to the processor 810 and to a display 828. A coder/decoder (CODEC) 834 can also be coupled to the processor 810. A speaker 836 and a microphone 838 can be coupled to the CODEC 834.

FIG. 8 also indicates that a wireless controller 840 can be coupled to the processor 810 and to a wireless antenna 842. In a particular example, the processor 810, the display controller 826, the memory 832, the CODEC 834, and the wireless controller 840 are included in a system-in-package or system-on-chip device 822. In a particular example, an input device 830 and a power supply 844 are coupled to the system-on-chip device 822. Moreover, in a particular example, as illustrated in FIG. 8, the display 828, the input device 830, the speaker 836, the microphone 838, the wireless antenna 842, and the power supply 844 are external to the system-on-chip device 822. However, each of the display 828, the input device 830, the speaker 836, the microphone 838, the wireless antenna 842, and the power supply 844 can be coupled to a component of the system-on-chip device 822, such as an interface or a controller.

In conjunction with the described aspects, an apparatus is disclosed that may include means for storing data including a plurality of rows of storage elements, such as the first memory bank 180, the second memory bank 182 of FIG. 1, one or more of the memory banks 310-324 of FIG. 3, the memory 832, one or more other devices or circuits configured to store data that include a plurality of rows of storage elements, or any combination thereof. Each row of the plurality of rows may be coupled to a particular word line.

The apparatus may also include means for storing information identifying word lines coupled to weak storage elements, such as a non-volatile memory (e.g., the OTP memory 102), one or more other devices or circuits configured to store information identifying word lines coupled to weak storage elements, or a combination thereof.

The apparatus may further include means for refreshing word lines configured to group a plurality of word lines having distinct bank offsets onto a single refresh address and perform a refresh of the single refresh address, such as the peripheral circuitry 164, the refresh circuitry 864, one or more other devices or circuits configured to group a plurality of word lines having distinct bank offsets onto a single refresh address and perform a refresh of the single refresh address, or a combination thereof. Each of the plurality of word lines may be coupled to a corresponding weak storage element.

Those of skill would further appreciate that the various illustrative logical blocks, configurations, modules, circuits, and algorithm steps described in connection with the aspects disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the aspects disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed examples is provided to enable a person skilled in the art to make or use the disclosed examples. Various modifications to these examples will be readily apparent to those skilled in the art, and the principles defined herein may be applied to other examples without departing from the scope of the disclosure. Thus, the present disclosure is not intended to be limited to the examples shown herein but is to be accorded the widest scope possible consistent with the principles and novel features as defined by the following claims.

What is claimed is:

1. A method of performing refresh operations on a storage device comprising:
   identifying word lines coupled to weak storage elements;
   grouping a plurality of word lines having distinct bank offsets onto a single refresh address, each of the plurality of word lines coupled to a corresponding weak storage element; and
   performing a refresh of the single refresh address.

2. The method of claim 1, wherein the storage device includes data that maps a particular refresh address to a group of word line addresses.

3. The method of claim 1, wherein grouping the plurality of word lines onto the single refresh address comprises mapping the single refresh address to a plurality of word line addresses of the plurality of word lines.

4. The method of claim 3, wherein the single refresh address is mapped to the plurality of word line addresses based on data stored in a one-time programmable memory.

5. The method of claim 1, wherein each of the plurality of word lines is refreshed more frequently than second word lines that are not coupled to weak storage elements.

6. The method of claim 5, wherein a first refresh rate of the single refresh address is substantially twice a second refresh rate of a second refresh address of the second word lines.

7. The method of claim 5, wherein the plurality of word lines is refreshed according to a first refresh schedule that is independent of a second refresh schedule used to refresh the second word lines.

8. The method of claim 1, wherein a duration between consecutive refreshes of each of the plurality of word lines is the same.

9. The method of claim 1, further comprising:
   determining the single refresh address based on a counter; and
   updating the counter subsequent to determining the single refresh address.

10. The method of claim 1, wherein each of the weak storage elements has a data retention time that is less than a threshold retention time.

11. A device comprising:
   a memory array including a plurality of rows of storage elements, each row coupled to a particular word line;
   a storage device configured to store information identifying word lines coupled to weak storage elements; and
   refresh circuitry configured to:
      group a plurality of word lines having distinct bank offsets onto a single refresh address, each of the plurality of word lines coupled to a corresponding weak storage element; and
      perform a refresh of the single refresh address.

12. The device of claim 11, wherein the refresh circuitry is configured to group the plurality of word lines by mapping the single refresh address to a plurality of word line addresses of the plurality of word lines, and wherein the information identifying the word lines maps a particular refresh address to a group of word line addresses.

13. The device of claim 11, wherein the plurality of word lines includes a first word line of a first memory bank of the memory array and a second word line of a second memory bank of the memory array.

14. The device of claim 11, wherein the storage device includes one-time programmable memory that is configured to store data that maps the single refresh address to a plurality of word line addresses of the plurality of word lines.

15. The device of claim 11, wherein the refresh circuitry is further configured to:
   load a first word line address of a first word line of the plurality of word lines to a row address buffer, and
   latch the first word line address by activating a first row strobe,
   wherein the refresh of the single refresh address is performed by:
      activating the first word line, and
      while the first word line is activated, reading first data of a first row of storage elements and writing the first data to the first row of storage elements, and
   wherein the first row of storage elements corresponds to the first word line.

16. The device of claim 15, wherein the refresh circuitry is further configured to perform the refresh in response to receiving a refresh command, wherein the first word line address is latched prior to receiving the refresh command.

17. The device of claim 15, wherein the refresh circuitry is further configured to:
   load a second word line address of a second word line of the plurality of word lines to the row address buffer, and
   latch the second word line address by activating a second row strobe,
   wherein the refresh of the single refresh address is performed by:
      activating the second word line subsequent to writing the first data to the first row of storage elements, and
      while the second word line is activated, reading second data of a second row of storage elements and writing the second data to the second row of storage elements, and
   wherein the second row of storage elements corresponds to the second word line.

18. The device of claim 11, wherein the refresh circuitry is further configured to refresh each of the plurality of word lines more frequently than second word lines that are not coupled to weak storage elements.

19. The device of claim 18, wherein the refresh circuitry is further configured to refresh the plurality of word lines according to a first refresh schedule and to refresh the second word lines according to a second refresh schedule.

20. The device of claim 18, wherein the refresh circuitry is further configured to refresh the second word lines by:
   reading data of a second plurality of rows of storage elements, and
   writing the data to the second plurality of rows of storage elements,
   wherein the second plurality of rows of storage elements is coupled to the second word lines, and
   wherein each word line of the second word lines has a same bank offset.

21. A system comprising:
   a memory array including a plurality of rows of storage elements, each row coupled to a particular word line;
   a storage device configured to store information identifying word lines coupled to weak storage elements; and
   refresh circuitry configured to:
      group a plurality of word lines having distinct bank offsets onto a single refresh address, each of the plurality of word lines coupled to a corresponding weak storage element; and
      perform a refresh of the single refresh address.

22. The system of claim 21,
   wherein the plurality of word lines includes a first set of word lines of a first memory bank and a second set of word lines of a second memory bank,
   wherein a first word line of the first set of word lines has a bank offset, and
   wherein the second set of word lines excludes a second word line having the bank offset.

23. The system of claim 21, wherein the refresh circuitry is further configured to:
   determine the single refresh address based on a counter; and
   update the counter subsequent to performing the refresh of the single refresh address.

24. The system of claim 21, wherein the refresh circuitry is further configured to refresh each of the plurality of word lines more frequently than second word lines that are not coupled to weak storage elements.

25. The system of claim 24, wherein the refresh circuitry is further configured to:
   refresh the plurality of word lines based on a first refresh schedule, and
   refresh the second word lines based on a second refresh schedule.

26. The system of claim 25, wherein the refresh circuitry is further configured to:
   determine to perform the refresh according to the first refresh schedule based on a counter; and
   update the counter subsequent to performing the refresh.

27. The system of claim 21, wherein the refresh circuitry is further configured to map the single refresh address to a plurality of word line addresses of the plurality of word lines, and wherein the refresh of the single refresh address is performed by:
   latching the word line addresses,
   activating the plurality of word lines, and
   while a particular word line of the plurality of word lines is activated, reading data of a corresponding row of storage elements, and writing the data to the corresponding row of storage elements.

28. The system of claim 21, wherein the refresh circuitry is further configured to latch word line addresses of the plurality of word lines prior to receiving a refresh command, wherein the refresh is performed in response to receiving the refresh command, and wherein the refresh is performed by:
- activating the plurality of word lines, and
- while a particular word line of the plurality of word lines is activated, reading data of a corresponding row of storage elements and writing the data to the corresponding row of storage elements.

29. An apparatus comprising:
- means for storing data including a plurality of rows of storage elements, each row coupled to a particular word line;
- means for storing information identifying word lines coupled to weak storage elements; and
- means for refreshing word lines configured to:
  - group a plurality of word lines having distinct bank offsets onto a single refresh address, each of the plurality of word lines coupled to a corresponding weak storage element; and
  - perform a refresh of the single refresh address.

30. The apparatus of claim 29, wherein the means for storing data, the means for storing information identifying word lines, and the means for refreshing word lines are integrated into a communications device, a personal digital assistant (PDA), a tablet, a computer, a music player, a video player, an entertainment unit, a navigation device, or a set top box.

* * * * *